United States Patent
Lee et al.

(10) Patent No.: US 9,173,294 B2
(45) Date of Patent: Oct. 27, 2015

(54) MULTILAYER CERAMIC ELECTRONIC COMPONENT TO BE EMBEDDED IN BOARD AND PRINTED CIRCUIT BOARD HAVING MULTILAYER CERAMIC ELECTRONIC COMPONENT EMBEDDED THEREIN

(71) Applicant: SAMSUNG ELECTRO-MECHANICS CO., LTD., Suwon-Si, Gyeonggi-Do (KR)

(72) Inventors: Byoung Hwa Lee, Suwon-Si (KR); Hai Joon Lee, Suwon-Si (KR); Eun Hyuk Chae, Suwon-Si (KR); Bae Gen Lee, Suwon-Si (KR); Jin Man Jung, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 41 days.

(21) Appl. No.: 14/213,185

(22) Filed: Mar. 14, 2014

(65) Prior Publication Data

US 2015/0041199 A1 Feb. 12, 2015

(30) Foreign Application Priority Data

Aug. 9, 2013 (KR) .......................... 10-2013-0094686

(51) Int. Cl.
*H05K 1/18* (2006.01)
*H01G 2/06* (2006.01)
*H01G 4/005* (2006.01) *H01G 4/30* (2006.01)
*H05K 1/03* (2006.01)

(52) U.S. Cl.
CPC ................ *H05K 1/185* (2013.01); *H01G 2/06* (2013.01); *H01G 4/005* (2013.01); *H01G 4/30* (2013.01); *H05K 1/0306* (2013.01); *H05K 2201/10015* (2013.01); *H05K 2201/10636* (2013.01)

(58) Field of Classification Search
CPC ....... H05K 1/185; H05K 1/186; H05K 1/187; H05K 1/188; H05K 1/0306; H01G 2/06; H01G 2/065
See application file for complete search history.

(56) References Cited

U.S. PATENT DOCUMENTS

2005/0248908 A1  11/2005  Dreezen et al.
2008/0291600 A1  11/2008  Takashima et al.

FOREIGN PATENT DOCUMENTS

JP        2009004734 A      1/2009
KR   10-2006-0047733 A      5/2006
KR   10-2009-0083568 A      8/2009

*Primary Examiner* — Jeremy C Norris
(74) *Attorney, Agent, or Firm* — McDermott Will & Emery LLP

(57) ABSTRACT

A multilayer ceramic electronic component to be embedded in a board includes: a ceramic body including dielectric layers; first and second internal electrodes formed in the ceramic body; and first-polarity external electrodes connected to the first internal electrodes, and second-polarity external electrodes connected to the second internal electrodes, wherein the number of the first-polarity external electrodes and the number of the second-polarity external electrodes may be two or more, the first-polarity and second-polarity external electrodes may include first-polarity and second-polarity base electrodes and first-polarity and second-polarity terminal electrodes formed on the first-polarity and second-polarity base electrodes, respectively, when L denotes a length of the ceramic body and W denotes a width thereof, $W/L \geq 0.6$ may be satisfied, and a width BW of each of the first-polarity and second-polarity external electrodes formed on the first and second main surfaces of the ceramic body may satisfy $150\ \mu m \leq BW \leq 350\ \mu m$.

16 Claims, 4 Drawing Sheets

X – X'

MULTILAYER CERAMIC ELECTRONIC COMPONENT TO BE EMBEDDED IN BOARD AND PRINTED CIRCUIT BOARD HAVING MULTILAYER CERAMIC ELECTRONIC COMPONENT EMBEDDED THEREIN

CROSS-REFERENCE TO RELATED APPLICATION

This application claims the benefit of Korean Patent Application No. 10-2013-0094686 filed on Aug. 9, 2013, with the Korean Intellectual Property Office, the disclosure of which is incorporated herein by reference.

BACKGROUND

The present disclosure relates to a multilayer ceramic electronic component to be embedded in a board, and a printed circuit board having the multilayer ceramic electronic component embedded therein.

As electronic circuits have become highly densified and highly integrated, a mounting space for passive elements mounted on a printed circuit board (PCB) has become insufficient. In order to solve this problem, ongoing efforts have been made to implement components able to be installed within a board, such as embedded devices. Particularly, various methods have been proposed for installing a multilayer ceramic electronic component used as a capacitive component within a board.

As one of a variety of methods of installing a multilayer ceramic electronic component within a board, the same dielectric material used for a multilayer ceramic electronic component is used as a material for a board and a copper wiring, or the like, is used as an electrode. Other methods for implementing an embedded multilayer ceramic electronic component include forming an embedded multilayer ceramic electronic component by forming a polymer sheet having high-k dielectrics or a dielectric thin film within a board, installing a multilayer ceramic electronic component within a board, and the like.

In general, a multilayer ceramic electronic component includes a plurality of dielectric layers made of a ceramic material and internal electrodes interposed therebetween. By disposing a multilayer ceramic electronic component within a board, an embedded multilayer ceramic electronic component having high capacitance may be implemented.

In order to manufacture a printed circuit board (PCB) including an embedded multilayer ceramic electronic component, a multilayer ceramic electronic component may be inserted into a core board, and via holes are required to be formed in an upper stacked plate and a lower stacked plate by using a laser in order to connect board wirings and external electrodes of the multilayer ceramic electronic component. Laser beam machining, however, considerably increases manufacturing costs of a PCB.

Meanwhile, an embedded multilayer ceramic electronic component is installed in a core part within a board, so a nickel/tin (Ni/Sn) plated layer on external electrodes thereof is not required, unlike a general multilayer ceramic electronic component mounted on a surface of a board.

Namely, since external electrodes of an embedded multilayer ceramic electronic component are electrically connected to a circuit within a board through a via made of a copper (Cu) material, a copper (Cu) layer, rather than a nickel/tin (Ni/Sn) layer, is required to be formed on the external electrodes.

In general, external electrodes may include copper (Cu) as a main ingredient, but since external electrodes include glass, a component included in the glass may absorb a laser in the event of laser beam machining to form a via within a board, making it difficult to adjust a process depth of the via.

For this reason, a copper (Cu) plated layer is separately formed on external electrodes of an embedded multilayer ceramic electronic component.

Meanwhile, an embedded multilayer ceramic electronic component may be installed in a printed circuit board used in a memory card, a personal computer (PC) main board, various radio frequency (RF) modules, thereby significantly decreasing a size of a product as compared with a multilayer ceramic electronic component mounted on a board.

In addition, since the embedded multilayer ceramic electronic component may be disposed to be very close to an input terminal of an active device such as a micro processor unit (MPU), interconnection inductance due to a conducting wire length may be decreased.

An inductance decrease in the multilayer ceramic electronic component embedded in the board is merely due to the decrease in interconnection inductance obtained by a unique arrangement, that is, an embedded scheme. Equivalent series inductance (ESL) improvement in a multilayer ceramic electronic component to be embedded in a board has still been needed.

Generally, in the case of a multilayer ceramic electronic component to be embedded in a board, a current path in the multilayer ceramic electronic component needs to be shortened in order to decrease the ESL.

However, since the copper (Cu) plated layer is separately formed on the external electrodes of the embedded multilayer ceramic electronic component, a plating solution may permeate into the external electrodes, whereby it is not easy to shorten the current path in the multilayer ceramic electronic component.

In addition, in accordance with an increase in a speed of an application processor (AP), the use of a multilayer ceramic electronic component embedded in a board has increased and the number of components to be embedded in a package has increased, whereby an occupied area has continuously increased.

RELATED ART DOCUMENT (Patent Document 1) Korean Patent Laid-Open Publication No. 2006-0047733

SUMMARY

An aspect of the present disclosure may provide a multilayer ceramic electronic component to be embedded in a board, and a printed circuit board having the multilayer ceramic electronic component embedded therein.

According to an aspect of the present disclosure, a multilayer ceramic electronic component to be embedded in a board may include: a ceramic body including dielectric layers and having first and second main surfaces opposing each other, first and second side surfaces opposing each other, and first and second end surfaces opposing each other; first internal electrodes formed in the ceramic body and having first and second lead parts exposed to the respective first and second side surfaces of the ceramic body, and second internal electrodes formed in the ceramic body and having third and fourth lead parts exposed to the respective first and second side surfaces of the ceramic body and spaced apart from the first and second lead parts by a predetermined interval; and first-polarity external electrodes extending from the side surfaces of the ceramic body to the first and second main surfaces thereof and connected to the first and second lead parts of the first internal electrodes, respectively, and second-polarity external electrodes extending from the side surfaces of the ceramic body to the first and second main surfaces thereof and connected to the third and fourth lead parts of the second internal electrodes, respectively, wherein the number of the first-polarity external electrodes and the number of the second-polarity external electrodes may be two or more, the first-polarity and second-polarity external electrodes may include first-polarity and second-polarity base electrodes and first-polarity and second-polarity terminal electrodes formed on the first-polarity and second-polarity base electrodes, respectively, when L denotes a length of the ceramic body and W denotes a width thereof, $W/L \geq 0.6$ may be satisfied, and a width BW of each of the first-polarity and second-polarity external electrodes formed on the first and second main surfaces of the ceramic body may satisfy $150\ \mu m \leq BW \leq 350\ \mu m$.

The first internal electrode may include a first region having the first lead part and a second region spaced apart from the first region by a predetermined distance in a length direction of the ceramic body and having the second lead part.

The second internal electrode may include a third region having the third lead part and a fourth region spaced apart from the third region by a predetermined distance in a length direction of the ceramic body and having the fourth lead part.

The first-polarity and second-polarity terminal electrodes may be formed of copper (Cu).

A thickness tp of each of the first-polarity and second-polarity terminal electrodes may be 5 μm or greater ($tp \geq 5\ \mu m$).

When a surface roughness of each of the first-polarity and second-polarity terminal electrodes is Ra and a thickness of each of the first-polarity and second-polarity terminal electrodes is tp, $200\ nm \leq Ra \leq tp$ may be satisfied.

The first-polarity and second-polarity terminal electrodes may be formed by plating.

A thickness ts of the ceramic body may be 250 μm or less ($ts \leq 250\ \mu m$).

According to another aspect of the present disclosure, a printed circuit board having a multilayer ceramic electronic component embedded therein may include: an insulating board; and a multilayer ceramic electronic component embedded in the insulating board and including a ceramic body including dielectric layers and having first and second main surfaces opposing each other, first and second side surfaces opposing each other, and first and second end surfaces opposing each other; first internal electrodes formed in the ceramic body and having first and second lead parts exposed to the respective first and second side surfaces of the ceramic body, and second internal electrodes formed in the ceramic body and having third and fourth lead parts exposed to the respective first and second side surfaces of the ceramic body and spaced apart from the first and second lead parts by a predetermined interval; and first-polarity external electrodes extending from the side surfaces of the ceramic body to the first and second main surfaces thereof and connected to the first and second lead parts of the first internal electrodes, respectively, and second-polarity external electrodes extending from the side surfaces of the ceramic body to the first and second main surfaces thereof and connected to the third and fourth lead parts of the second internal electrodes, respectively, wherein the number of the first-polarity external electrodes and the number of the second-polarity external electrodes may be two or more, the first-polarity and second-polarity external electrodes may include first-polarity and second-polarity base electrodes and first-polarity and second-polarity terminal electrodes formed on the first-polarity and second-polarity base electrodes, respectively, when L denotes a length of the ceramic body and W denotes a width thereof, $W/L \geq 0.6$ may be satisfied, and a width BW of each of the first-polarity and second-polarity external electrodes formed on the first and second main surfaces of the ceramic body may satisfy $150\ \mu m \leq BW \leq 350\ \mu m$.

The first internal electrode may include a first region having the first lead part and a second region spaced apart from the first region by a predetermined distance in a length direction of the ceramic body and having the second lead part.

The second internal electrode may include a third region having the third lead part and a fourth region spaced apart from the third region by a predetermined distance in a length direction of the ceramic body and having the fourth lead part.

The first-polarity and second-polarity terminal electrodes may be formed of copper (Cu).

A thickness tp of each of the first-polarity and second-polarity terminal electrodes may be 5 μm or greater ($tp \geq 5\ \mu m$).

When Ra denotes a surface roughness of each of the first-polarity and second-polarity terminal electrodes and tp denotes a thickness of each of the first-polarity and second-polarity terminal electrodes, $200\ nm \leq Ra \leq tp$ may be satisfied.

The first-polarity and second-polarity terminal electrodes may be formed by plating.

A thickness ts of the ceramic body may be 250 μm or less ($ts \leq 250\ \mu m$).

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
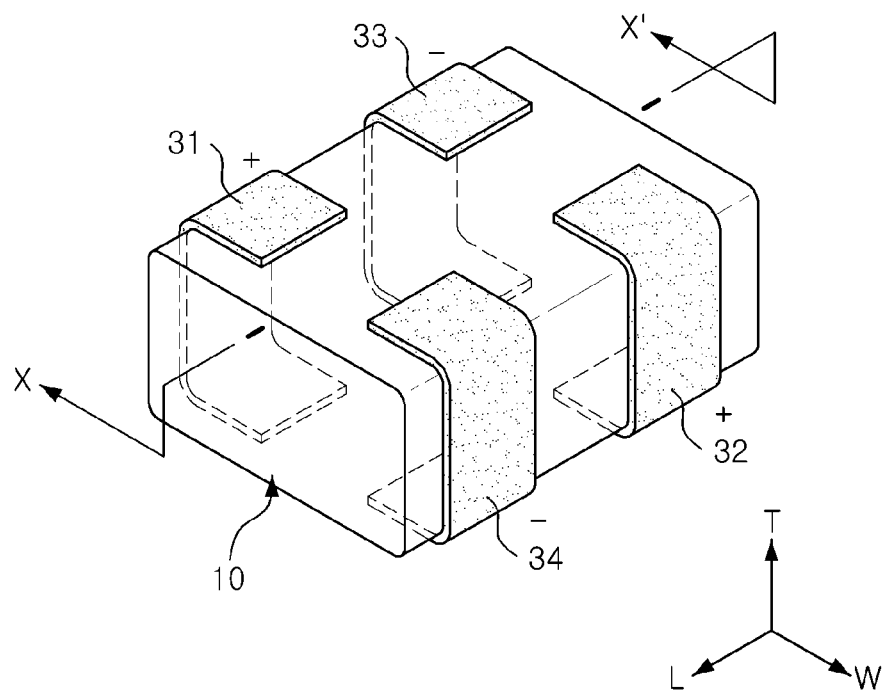
FIG. 1 is a perspective view showing a multilayer ceramic electronic component to be embedded in a board according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Electronic Component to be Embedded in Board

Hereinafter, exemplary embodiments of the present disclosure will be described in detail with reference to the accompanying drawings.

FIG. 1 is a perspective view showing a multilayer ceramic electronic component to be embedded in a board according to an exemplary embodiment of the present disclosure.

Figure 2:
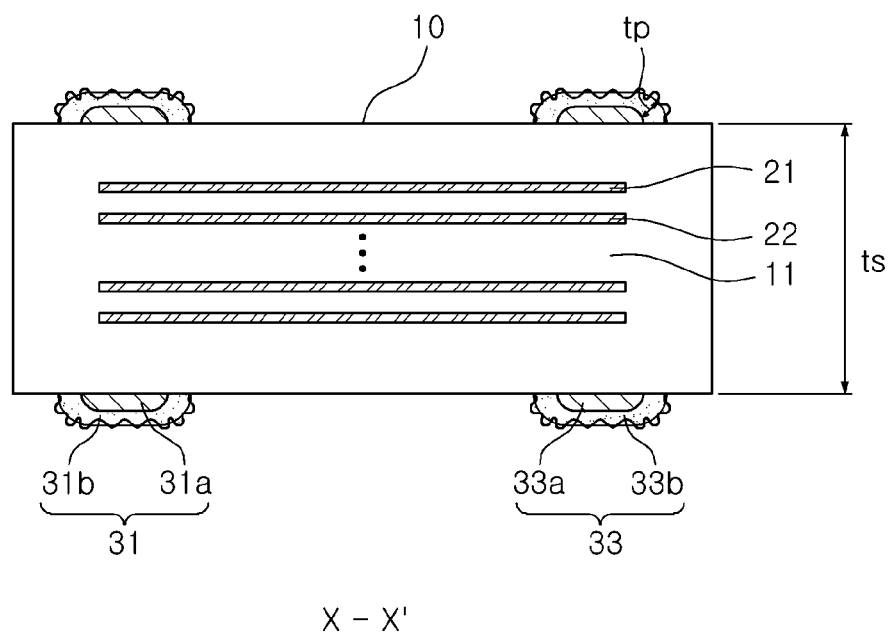
FIG. 2 is a cross-sectional view taken along line X-X' of FIG. 1.

FIG. 2 is a cross-sectional view taken along line X-X' of FIG. 1.

Figure 3:
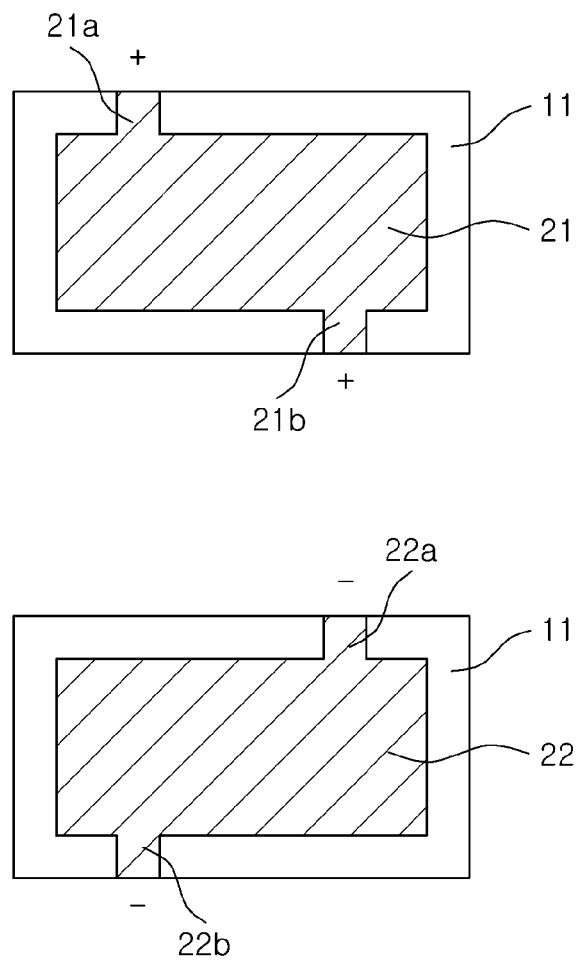
FIG. 3 is a plan view showing first and second internal electrodes of a multilayer ceramic electronic component to be embedded in a board according to an exemplary embodiment of the present disclosure.

FIG. 3 is a plan view showing first and second internal electrodes of the multilayer ceramic electronic component to be embedded in a board according to the exemplary embodiment of the present disclosure.

Referring to FIGS. 1 through 3, a multilayer ceramic electronic component to be embedded in a board according to an exemplary embodiment of the present disclosure may include a ceramic body 10 including dielectric layers 11 and having first and second main surfaces opposing each other, first and second side surfaces opposing each other, and first and second end surfaces opposing each other; first internal electrodes 21 formed in the ceramic body 10 and having first and second lead parts 21a and 21b exposed to the respective first and second side surfaces of the ceramic body 10 and second internal electrodes formed in the ceramic body 10 and having third and fourth lead parts 22a and 22b exposed to the first and second side surfaces of the ceramic body 10 and spaced apart from the first and second lead parts 21a and 21b by a predetermined interval; and first-polarity external electrodes 31 and 32 extending from the side surfaces of the ceramic body 10 to the first and second main surfaces thereof and connected to the first and second lead parts 21a and 21b of the first internal electrodes 21, respectively, and second-polarity external electrodes 33 and 34 extending from the side surfaces of the ceramic body 10 to the first and second main surfaces thereof and connected to the third and fourth lead parts 22a and 22b of the second internal electrodes 22, respectively, wherein the number of the first-polarity external electrodes and the number of the second-polarity external electrodes may be two or more, and the first-polarity and second-polarity external electrodes 31, 32, 33, and 34 may include first-polarity and second-polarity base electrodes 31a, 32a, 33a, and 34a and first-polarity and second-polarity terminal electrodes 31b, 32b, 33b, and 34b formed on the first-polarity and second-polarity base electrodes 31a, 32a, 33a, and 34a, respectively.

Hereinafter, a multilayer ceramic electronic component according to an exemplary embodiment of the present disclosure, particularly, a multilayer ceramic capacitor will be described. However, the present disclosure is not limited thereto.

In the multilayer ceramic capacitor according to the exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' refers to a direction in which the dielectric layers are stacked, that is, a 'stacked direction'.

In the exemplary embodiment of the present disclosure, a shape of the ceramic body 10 is not particularly limited, but may be hexahedral as shown.

In the exemplary embodiment of the present disclosure, the ceramic body 10 may have first and second main surfaces opposing each other, first and second side surfaces opposing each other, and first and second end surfaces opposing each other, wherein the first and second main surfaces may also be upper and lower surfaces of the ceramic body 10, respectively.

The ceramic body 10 may have a thickness ts of 250 μm or less.

As described above, the ceramic body 10 may be manufactured to have the thickness ts of 250 μm or less, such that it may be appropriate for a multilayer ceramic capacitor to be embedded in a board.

In addition, the thickness ts of the ceramic body 10 may be a distance between the first and second main surfaces.

According to an exemplary embodiment of the present disclosure, the multilayer ceramic capacitor may be a four-terminal capacitor, but is not limited thereto.

In this case, a first external electrode having a first polarity and a third external electrode having a second polarity may be disposed on the first side surface, and a fourth external electrode having the second polarity and a second external electrode having the first polarity may be disposed on the second side surface while facing the first external electrode and the third external electrode, respectively.

The first polarity may be a positive (+) polarity or a negative (−) polarity. In this case, the second polarity may be opposite to the first polarity.

As described above, the external electrodes having opposite polarities may be disposed at the left and right and may also be disposed to face each other, whereby a current path may be shortened, and equivalent series inductance (ESL) may be decreased.

According to an exemplary embodiment of the present disclosure, a raw material of the dielectric layer 11 is not particularly limited as long as sufficient capacitance may be obtained. For example, the material of the dielectric layer 11 may be a barium titanate ($BaTiO_3$) powder.

A material of the dielectric layer 11 may be prepared by adding various ceramic additives, organic solvents, plasticizers, binders, dispersing agents, and the like, to a powder such as the barium titanate ($BaTiO_3$) powder, or the like, according to purposes of the present disclosure.

An average particle size of the ceramic powder used to form the dielectric layer 11 is not particularly limited and may be adjusted to achieve the purpose of the present disclosure. For example, the average particle size of the ceramic powder may be adjusted to be 400 nm or less.

The ceramic body 10 may include an active layer contributing to generating capacitance of the capacitor, and upper and lower cover layers formed as upper and lower margin parts on and below the active layer, respectively.

The active layer may be formed by repeatedly stacking a plurality of first and second internal electrodes 21 and 22 with each of the dielectric layers 11 interposed therebetween.

The upper and lower cover layers may be formed of the same material as that of the dielectric layers 11 and have the same configuration as that of the dielectric layers 11 except that they do not include the internal electrodes.

The upper and lower cover layers may be formed by stacking one dielectric layer or two or more dielectric layers on upper and lower surfaces of the active layers, respectively, in a vertical direction, and may basically serve to prevent damages to the internal electrodes due to physical or chemical stress.

Particularly, in the multilayer ceramic electronic component to be embedded in a board, a copper (Cu) plated layer is separately formed on the external electrodes, and thus, the internal electrodes may be damaged due to permeation of a plating solution.

Therefore, in a general multilayer ceramic electronic component to be embedded in a board, upper and lower cover layers are relatively thick, so as to prevent a plating solution from being permeated into internal electrodes and damages thereto.

However, in the case in which the upper and lower cover layers are relatively thick as described above, a current path in the multilayer ceramic electronic component to be embedded in a board may be lengthened, such that it is not easy to decrease ESL.

The multilayer ceramic capacitor according to the exemplary embodiment of the present disclosure may include the first internal electrodes 21 formed in the ceramic body 10 and having the first and second lead parts 21a and 21b exposed to the first and second side surfaces of the ceramic body 10, respectively, and the second internal electrodes 22 formed in the ceramic body 10, having the third and fourth lead parts 22a and 22b exposed to the first and second side surfaces of the ceramic body 10, respectively, and spaced apart from the first and second lead parts 21a and 21b by a predetermined interval.

Therefore, the current path may be shortened to decrease the ESL.

Details related to the short current path and decrease in ESL will be provided below.

The first and second internal electrodes 21 and 22, a pair of electrodes having different polarities, may be formed by printing a conductive paste containing a conductive metal on the dielectric layer 11 at a predetermined thickness.

In addition, the first and second internal electrodes 21 and 22 may be formed in a direction in which the dielectric layers 11 are stacked and may be electrically insulated from each other by the dielectric layer 11 disposed therebetween.

Referring to FIG. 3, the first internal electrode 21 may have the first lead part 21a exposed to the first side surface of the ceramic body 10 and the second lead part 21b exposed to the second side surface of the ceramic body 10.

In addition, the second internal electrode 22 may have the third lead part 22a exposed to the first side surface of the ceramic body 10 and the fourth lead part 22b exposed to the second side surface of the ceramic body 10.

That is, the first and second internal electrodes 21 and 22 may be electrically connected to the first-polarity and second-polarity external electrodes 31, 32, 33, and 34, respectively, through the lead parts exposed to the first and second side surfaces of the ceramic body 10.

Therefore, when voltage is applied to the first-polarity and second-polarity external electrodes 31, 32, 33, and 34, charges may be accumulated between the first and second internal electrodes 21 and 22 facing each other. In this case, capacitance of the multilayer ceramic capacitor may be in proportion to an area of a region in which the first and second internal electrodes 21 and 22 are overlapped with each other.

Although patterns of the first and second internal electrodes have been shown in FIG. 3, these are only examplary. That is, the first and second internal electrodes are not limited to being formed in the patterns shown in FIG. 3, but may be formed in various patterns.

In addition, the conductive metal contained in the conductive paste forming the first and second internal electrodes 21 and 22 may be nickel (Ni), copper (Cu), palladium (Pd), or an alloy thereof. However, the present disclosure is not limited thereto.

In addition, as a method of printing the conductive paste, a screen printing method, a gravure printing method, or the like, may be used. However, the present disclosure is not limited thereto.

According to the exemplary embodiment of the present disclosure, the first-polarity external electrodes 31 and 32 extending from the first and second side surfaces of the ceramic body 10 to the first and second main surfaces thereof and connected to the first and second lead parts 21a and 21b of the first internal electrodes 21, respectively, and the second-polarity external electrodes 33 and 34 extending from the first and second side surfaces of the ceramic body 10 to the first and second main surfaces thereof and connected to the third and fourth lead parts 22a and 22b of the second internal electrodes 22, respectively, may be formed.

The number of the first-polarity external electrodes and the number of the second-polarity external electrodes 31, 32, 33, and 34 may be two or more, and the first-polarity and second-polarity external electrodes 31, 32, 33, and 34 may include the first-polarity and second-polarity base electrodes 31a, 32a, 33a, and 34a and the first-polarity and second-polarity terminal electrodes 31b, 32b, 33b, and 34b formed on the first-polarity and second-polarity base electrodes 31a, 32a, 33a, and 34a, respectively.

Hereinafter, structures of the first-polarity and second-polarity external electrodes 31, 32, 33, and 34 will be described in detail.

The first-polarity and second-polarity base electrodes 31a, 32a, 33a, and 34a may contain a first conductive metal and a glass.

The first-polarity and second-polarity external electrodes 31, 32, 33, and 34 may be formed on the first and second side surfaces of the ceramic body 10 in order to generate capacitance, and the first-polarity and second-polarity base electrodes 31a, 32a, 33a, and 34a included in the first-polarity and second-polarity external electrodes 31, 32, 33, and 34 may be electrically connected to the first and second internal electrodes 21 and 22, respectively.

The first-polarity and second-polarity base electrodes 31a, 32a, 33a, and 34a may be formed of the same conductive material as that of the first and second internal electrodes 21 and 22, but are not limited thereto. For example, the first-polarity and second-polarity base electrodes 31a, 32a, 33a, and 34a may be formed of at least one first conductive metal selected from a group consisting of copper (Cu), silver (Ag), nickel (Ni), and alloys thereof.

The first-polarity and second-polarity base electrodes 31a, 32a, 33a, and 34a may be formed by applying and sintering a conductive paste prepared by adding glass frit to a powder formed of the first conductive metal.

According to the exemplary embodiment of the present disclosure, the first-polarity and second-polarity external electrodes 31, 32, 33, and 34 may include the first-polarity and second-polarity terminal electrodes 31b, 32b, 33b, and 34b formed on the first-polarity and second-polarity base electrodes 31a, 32a, 33a, and 34a, respectively.

The first-polarity and second-polarity terminal electrodes 31b, 32b, 33b, and 34b may be formed of a second conductive material.

The second conductive material is not particularly limited, but may be, for example, copper (Cu).

In general, a multilayer ceramic capacitor may be mounted on a printed circuit board, and nickel/tin plated layers may be usually formed on external electrodes.

However, the multilayer ceramic capacitor according to this exemplary embodiment of the present disclosure is embedded in the printed circuit board, not being mounted on the board, and the first-polarity external electrodes 31 and 32 and the second-polarity external electrodes 33 and 34 of the multilayer ceramic capacitor may be electrically connected to circuits of the board through vias formed of copper (Cu).

Therefore, according to the exemplary embodiment of the present disclosure, the first-polarity and second-polarity terminal electrodes 31b, 32b, 33b, and 34b may be formed of copper (Cu) having good electrical connectivity with the copper (Cu) filling the vias formed in the board.

Meanwhile, the first-polarity and second-polarity base electrodes 31a, 32a, 33a, and 34a may contain copper (Cu) as a main component, but also contain a glass. Therefore, a component contained in the glass may absorb laser at the time of performing laser processing in order to form the via in the board, making it difficult to adjust a depth of the via.

For this reason, the first-polarity and second-polarity terminal electrodes 31b, 32b, 33b, and 34b of the multilayer ceramic electronic component to be embedded in a board may be formed of copper (Cu).

A method of forming the first-polarity and second-polarity terminal electrodes 31b, 32b, 33b, and 34b is not particularly limited, but may be, for example, a plating method.

Therefore, the first-polarity and second-polarity terminal electrodes 31b, 32b, 33b, and 34b after sintering may only be formed of copper (Cu) and do not contain glass frit. Accordingly, the aforementioned problem that a component contained in the glass may absorb the laser at the time of laser processing in order to form the via in the board, making it difficult to adjust the depth of the via, may not occur.

As described above, the first external electrode 31 having the first polarity and the third external electrode 33 having the second polarity may be disposed on the first side surface of the ceramic body 10 while being spaced apart from each other, and the fourth external electrode 34 having the second polarity and the second external electrode 32 having the first polarity may be disposed on the second side surface of the ceramic body 10 while being spaced apart from each other.

In addition, the fourth external electrode and the second external electrode may be disposed to face the first external electrode and the third external electrode, respectively.

As described above, the external electrodes having opposite polarities may be disposed at the left and right and may also be disposed to face each other, such that they may be disposed to be adjacent to each other on the side surfaces of the ceramic body, whereby a current path may be shortened.

Therefore, ESL may be decreased.

In addition, the number of multilayer ceramic electronic components to be embedded in a board may be decreased whereby an occupied area may be decreased.

That is, a multilayer ceramic capacitor having four or more terminals may be formed, such that two or more multilayer ceramic capacitors may be manufactured as one chip. Therefore, an area occupied by the multilayer ceramic electronic components may be decreased.

In addition, in spite of implementing the multilayer ceramic capacitor having four or more terminals as described above, the external electrodes having opposite polarities may be disposed to be adjacent to each other on each side surface of the ceramic body, whereby the current path may be shortened, and the ESL may be decreased.

Figure 4:
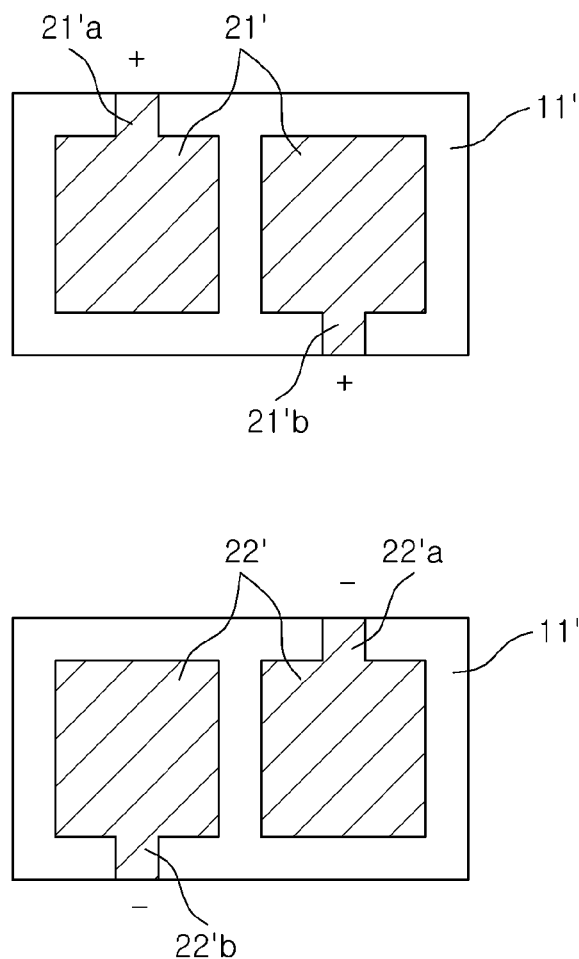
FIG. 4 is a plan view showing first and second internal electrodes of a multilayer ceramic electronic component to be embedded in a board according to another exemplary embodiment of the present disclosure.

FIG. 4 is a plan view showing first and second internal electrodes of a multilayer ceramic electronic component to be embedded in a board according to another exemplary embodiment of the present disclosure.

Referring to FIG. 4, in a multilayer ceramic electronic component to be embedded in a board according to this exemplary embodiment of the present disclosure, a first internal electrode 21' may include a first region having a first lead part 21'a and a second region spaced apart from the first region by a predetermined distance in the length direction of the ceramic body 10 and having a second lead part 21'b.

In addition, a second internal electrode 22' may include a third region having a third lead part 22'a and a fourth region spaced apart from the third region by a predetermined distance in the length direction of the ceramic body and having a fourth lead part 22'b.

Figure 5:
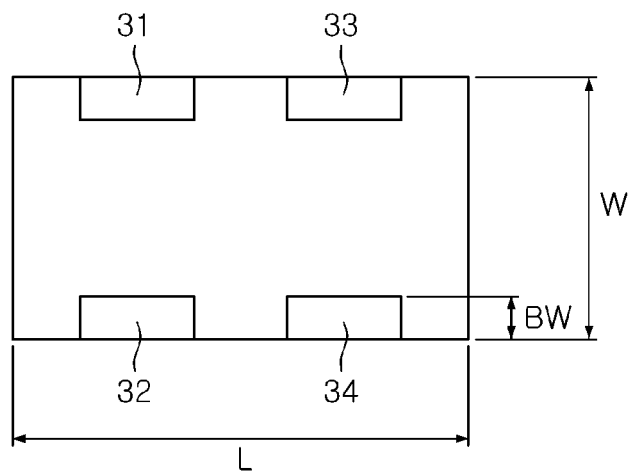
FIG. 5 is a plan view of a multilayer ceramic electronic component to be embedded in a board according to an exemplary embodiment of the present disclosure.

FIG. 5 is a plan view of a multilayer ceramic electronic component to be embedded in a board according to an exemplary embodiment of the present disclosure.

Referring to FIG. 5, in the multilayer ceramic capacitor according to this exemplary embodiment of the present disclosure, $W/L \geq 0.6$ may be satisfied when a length of the ceramic body 10 is L and a width thereof is W, and 150 $\mu m \leq BW \leq 350 \mu m$ may be satisfied when a width of each of the first-polarity and second-polarity external electrodes 31, 32, 33, and 34 formed on the first and second main surfaces of the ceramic body 10 is BW.

The length and the width of the ceramic body are controlled to satisfy $W/L \geq 0.6$, whereby inductance of the multilayer ceramic capacitor may be decreased.

In the case in which a value of W/L is less than 0.6, a decrease in inductance may be insufficient.

In addition, the width BW of each of the first-polarity and second-polarity external electrodes 31, 32, 33, and 34 formed on the first and second main surfaces of the ceramic body 10 satisfies 150 $\mu m \leq BW \leq 350 \mu m$ as described above, whereby inductance may be decreased and contact defects with a circuit and a via that may occur at the time of embedding the multilayer ceramic capacitor in the board may be solved.

In the case in which the width BW of each of the first-polarity and second-polarity external electrodes 31, 32, 33, and 34 formed on the first and second main surfaces of the ceramic body 10 is less than 150 $\mu m$, the contact defects with the circuit and the via may occur at the time of embedding the multilayer ceramic capacitor in the board.

Meanwhile, in the case in which the width BW of each of the first-polarity and second-polarity external electrodes 31, 32, 33, and 34 formed on the first and second main surfaces of the ceramic body 10 exceeds 350 $\mu m$, a distance between the external electrodes is close to each other, whereby insulating resistance may be decreased, causing a problem in reliability.

That is, in the case of a general multilayer ceramic capacitor, a ratio of a width of a ceramic body to a length thereof and a width of each of first-polarity and second-polarity external electrodes do not satisfy the above-mentioned numerical range, whereby problems such as an inductance decrease and a contact defect with a via may not be solved.

In addition, when a thickness of each of the first-polarity and second-polarity terminal electrodes 31b, 32b, 33b, and 34b is tp, $tp \geq 5 \mu m$ may be satisfied.

The thickness tp of each of the first-polarity and second-polarity terminal electrodes 31b, 32b, 33b, and 34b may satisfy $tp \geq 5 \mu m$, but is not limited thereto. In addition, the thickness tp of each of the first-polarity and second-polarity terminal electrodes 31b, 32b, 33b, and 34b may be 15 $\mu m$ or less.

As described above, the thickness tp of each of the first-polarity and second-polarity terminal electrodes 31b, 32b, 33b, and 34b is controlled to satisfy $tp \geq 5 \mu m$ and to be 15 $\mu m$ or less, whereby the via processing within the board may be facilitated and the multilayer ceramic capacitor may have excellent reliability.

In the case in which the thickness tp of each of the first-polarity and second-polarity terminal electrodes 31b, 32b, 33b, and 34b is less than 5 μm, a conductive via hole may be connected to the ceramic body 10 when it is formed at the time of embedding the multilayer ceramic electronic component in the printed circuit board.

In the case in which the thickness tp of each of the first-polarity and second-polarity terminal electrodes 31b, 32b, 33b, and 34b exceeds 15 μm, cracking may occur in the ceramic body 10 due to stress of the first-polarity and second-polarity terminal electrodes 31b, 32b, 33b, and 34b.

Meanwhile, referring to FIG. 2, when a surface roughness of the first-polarity and second-polarity terminal electrodes 31b, 32b, 33b, and 34b of the multilayer ceramic electronic component according to the exemplary embodiment of the present disclosure is Ra and the thickness of each of the first-polarity and second-polarity terminal electrodes 31b, 32b, 33b, and 34b is tp, 200 nm≤Ra≤tp may be satisfied.

The surface roughness Ra of the first-polarity and second-polarity terminal electrodes 31b, 32b, 33b, and 34b is controlled to satisfy 200 nm≤Ra≤tp, whereby delamination between the multilayer ceramic electronic component and the board may be decreased and cracking may be prevented.

The surface roughness indicates a degree of fine protrusion-depression generated on a metal surface when the metal surface is processed.

The surface roughness may be generated by a tool used for processing the metal surface, whether or not a processing method is appropriate, a scratch generated on the metal surface, rust, and the like. In expressing a degree of roughness, a cross-section of a surface taken by cutting the surface at a plane perpendicular to the surface may have a shape of a curve, and a height from the lowest point of this curve to the highest point thereof may be referred to as a center line average roughness and represented by Ra.

In the exemplary embodiment of the present disclosure, a center line average roughness of each of the first-polarity and second-polarity terminal electrodes 31b, 32b, 33b, and 34b is defined as Ra.

More specifically, a method of calculating the center line average roughness Ra of the first-polarity and second-polarity terminal electrodes 31b, 32b, 33b, and 34b will be described. First, a virtual center line may be drawn with respect to roughness formed on one surfaces of the first-polarity and second-polarity terminal electrodes 31b, 32b, 33b, and 34b.

Next, respective distances (for example, $r_1, r_2, r_3 \ldots r_{13}$) may be measured based on the virtual center line, an average value of the distances may be calculated as represented by the following Equation, and the center line average roughness Ra of the first-polarity and second-polarity terminal electrodes 31b, 32b, 33b, and 34b may be obtained as the calculated average value.

$$R_a = \frac{|r_1| + |r_2| + |r_3| + \ldots |r_n|}{n}$$

The center line average roughness Ra of each of the first-polarity and second-polarity terminal electrodes 31b, 32b, 33b, and 34b may be controlled in a range of 200 nm≤Ra≤tp, whereby a multilayer ceramic electronic component may have excellent withstand voltage characteristics, improved bonding with the board, and excellent reliability.

In the case in which the surface roughness of the first-polarity and second-polarity terminal electrodes 31b, 32b, 33b, and 34b is less than 200 nm, delamination between the multilayer ceramic electronic component and the board may occur.

Meanwhile, in the case in which the surface roughness of the first-polarity and second-polarity terminal electrodes 31b, 32b, 33b, and 34b exceeds the thickness tp of each of the first-polarity and second-polarity terminal electrodes 31b, 32b, 33b, and 34b, cracking may occur.

Hereinafter, a method of manufacturing a multilayer ceramic electronic component to be embedded in a board according to an exemplary embodiment of the present disclosure will be described. However, the present disclosure is not limited thereto.

In the method of manufacturing a multilayer ceramic electronic component to be embedded in a board according to this exemplary embodiment of the present disclosure, a slurry containing powder such as barium titanate ($BaTiO_3$) powder, or the like, may be applied to carrier films and dried to prepare a plurality of ceramic green sheets, thereby forming dielectric layers.

The ceramic green sheets may be manufactured by preparing a slurry by mixing ceramic powder, a binder, and a solvent with each other and forming the slurry as sheets having a thickness of several μm by a doctor blade method.

Next, a conductive paste for internal electrodes containing 40 to 50 parts by weight of nickel powder having an average particle size of 0.1 to 0.2 μm may be prepared.

The conductive paste for internal electrodes may be applied to the ceramic green sheets by a screen printing method to form the internal electrodes, and two hundred to three hundred ceramic green sheets may be stacked to manufacture the ceramic body 10.

In the multilayer ceramic capacitor according to the exemplary embodiment of the present disclosure, the first and second internal electrodes 21 and 22 may be exposed to both side surfaces of the ceramic body 10, respectively.

Next, the first-polarity and second-polarity base electrodes containing a first conductive metal and a glass may be formed on the side surfaces of the ceramic body 10.

The first conductive metal is not particularly limited, but may be, for example, at least one selected from a group consisting of copper (Cu), silver (Ag), nickel (Ni), and alloys thereof.

The glass is not particularly limited, but may be a material having the same composition as that of glass used for manufacturing external electrodes of a general multilayer ceramic capacitor.

The first-polarity and second-polarity base electrodes may be formed on the side surfaces of the ceramic body to thereby be electrically connected to the first and second internal electrodes, respectively.

Then, a plated layer formed of a second conductive metal may be formed on the first-polarity and second-polarity base electrodes.

The second conductive metal is not particularly limited, but may be, for example, copper (Cu).

The plated layer may be formed as first-polarity and second-polarity terminal electrodes.

A description of parts having the same features as those of the multilayer ceramic electronic component to be embedded in a board according to the above-described embodiment of the present disclosure will be omitted.

Hereafter, the present inventive concept will be described in detail with reference to Inventive Example, but is not limited thereto.

Inventive Example

A via processing defect rate and whether or not insulating resistance (IR) has been decreased depending on the width BW of each of the first-polarity and second-polarity external electrodes of a multilayer ceramic electronic component to be embedded in a board according to Inventive Example were measured.

In addition, in order to check the via processing defect rate and whether or not the insulating resistance (IR) has been decreased depending on the width BW of each of the first-polarity and second-polarity external electrodes whether or not a via processing defect has occurred depending on the thickness tp of each of the first-polarity and second-polarity terminal electrodes, and a frequency of delamination of a bonding surface depending on the surface roughness of the first-polarity and second-polarity terminal electrodes, a board having a multilayer ceramic electronic component embedded therein was left at a temperature of 85° C. and a relative humidity of 85%, corresponding to general conditions of a chip component for a mobile phone mother board, for thirty minutes, and respective experiments were performed.

The following Table 1 shows the via processing defect rate and whether or not the insulating resistance (IR) has been decreased depending on the width BW of each of the first-polarity and second-polarity external electrodes.

TABLE 1

| Width BW of First-Polarity and Second-Polarity External Electrodes (μm) | Via Processing Defect Rate | Defect Rate due to Insulating Resistance (IR) Decrease |
| --- | --- | --- |
| 100 | X | ⊚ |
| 130 | Δ | ⊚ |
| 150 | ○ | ⊚ |
| 180 | ⊚ | ⊚ |
| 200 | ⊚ | ⊚ |
| 250 | ⊚ | ⊚ |
| 300 | ⊚ | ⊚ |
| 350 | ⊚ | ○ |
| 400 | ⊚ | X |

X: defect rate of 50% or more
Δ: defect rate of 10% to 50%
○: defect rate of 0.01% to 10%
⊚: defect rate less than 0.01%

Referring to Table 1, it may be appreciated that in the case in which the width BW of each of the first-polarity and second-polarity external electrodes formed on the first and second main surfaces of the ceramic body is less than 150 μm, a contact defect with a circuit and a via occurs at the time of embedding the multilayer ceramic capacitor in the board.

In addition, it may be appreciated that in the case in which the width BW of each of the first-polarity and second-polarity external electrodes formed on the first and second main surfaces of the ceramic body exceeds 350 μm, a distance between the external electrodes is close to each other, such that the insulating resistance is decreased.

On the other hand, it may be appreciated that in the case in which the width BW of each of the first-polarity and second-polarity external electrodes formed on the first and second main surfaces of the ceramic body satisfies 150 μm≤BW≤350 μm, a contact defect with a circuit and a via does not occur at the time of embedding the multilayer ceramic capacitor in the board.

The following Table 2 shows whether or not the via processing defect has occurred depending on the thickness of each of the first-polarity and second-polarity terminal electrodes.

TABLE 2

| Thickness of First-Polarity and Second-Polarity Terminal Electrodes (μm) | Results |
| --- | --- |
| Less than 1 | X |
| 1~2 | X |
| 2~3 | X |
| 3~4 | Δ |
| 4~5 | ○ |
| 5~6 | ⊚ |
| 6 or more | ⊚ |

X: defect rate of 50% or more
Δ: defect rate of 10% to 50%
○: defect rate of 0.01% to 10%
⊚: defect rate less than 0.01%

Referring to Table 2, it could be appreciated that in the case in which the thickness of each of the first-polarity and second-polarity terminal electrodes is 5 μm or more, the via processing within the board may be facilitated and the multilayer ceramic capacitor may have excellent reliability.

On the other hand, it may be appreciated that in the case in which the thickness of each of the first-polarity and second-polarity terminal electrodes is less than 5 μm, a detect may occur at the time of processing the via in the board.

The following Table 3 shows the frequency of delamination of a bonding surface depending on the surface roughness of each of the first-polarity and second-polarity terminal electrodes.

TABLE 3

| Surface Roughness of First-Polarity and Second-Polarity Terminal Electrode (nm) | Results |
| --- | --- |
| Less than 50 | X |
| 50~100 | X |
| 100~150 | Δ |
| 150~200 | ○ |
| 200~250 | ⊚ |
| 250 or more | ⊚ |

X: defective rate of 50% or more
Δ: defective rate of 10% to 50%
○: defective rate of 0.01% to 10%
⊚: defective rate less than 0.01%

Referring to Table 3, it could be appreciated that in the case in which the surface roughness of each of the first-polarity and second-polarity terminal electrodes is 200 nm or more, the frequency of delamination of a bonding surface is low, such that the multilayer ceramic capacitor achieves excellent reliability.

On the other hand, it may be appreciated that in the case in which the surface roughness of each of the first-polarity and second-polarity terminal electrodes is less than 200 nm, the frequency of delamination of the adhesion surface increases, such that reliability is decreased.

Figure 6:
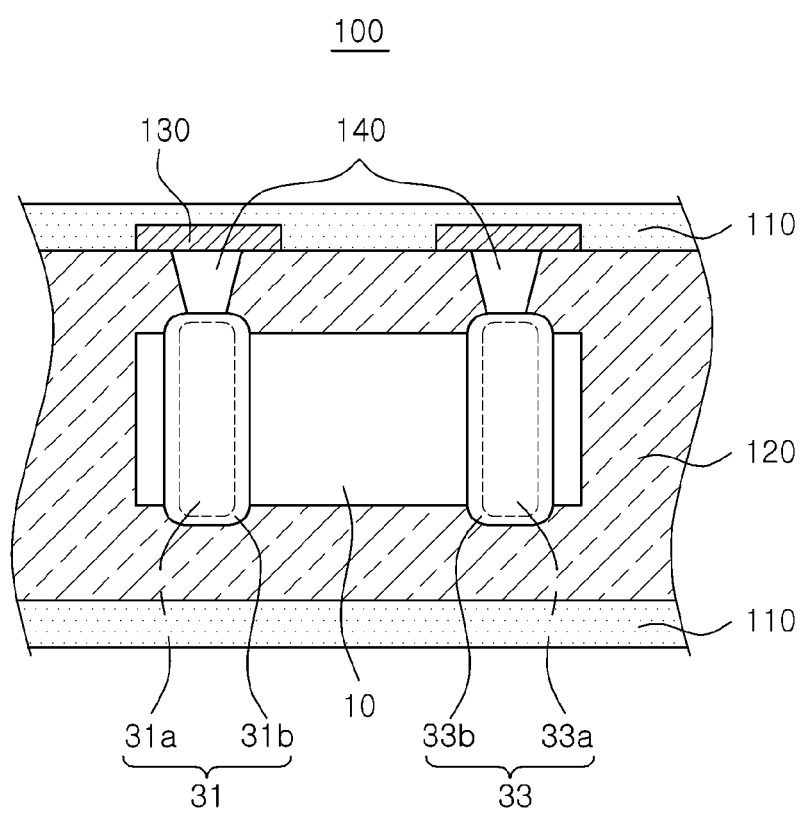
FIG. 6 is a cross-sectional view showing a printed circuit board having a multilayer ceramic electronic component embedded therein according to an exemplary embodiment of the present disclosure.

Printed Circuit Board Having Multilayer Ceramic Electronic Component Embedded Therein FIG. 6 is a cross-sectional view showing a printed circuit board having a multilayer ceramic electronic component embedded therein according to an exemplary embodiment of the present disclosure.

Referring to FIG. 6, a printed circuit board 100 having a multilayer ceramic electronic component embedded therein according to this exemplary embodiment of the present disclosure may include an insulating board 110; and a multilayer ceramic electronic component embedded in the insulating board 110 and including a ceramic body including dielectric layers and having first and second main surfaces opposing each other, first and second side surfaces opposing each other, and first and second end surfaces opposing each other, first internal electrodes formed in the ceramic body and having first and second lead parts exposed to the respective first and second side surfaces of the ceramic body, second internal electrodes formed in the ceramic body and having third and fourth lead parts exposed to the respective first and second side surfaces of the ceramic body and spaced apart from the first and second lead parts by a predetermined interval, first-polarity external electrodes extending from the side surfaces of the ceramic body to the first and second main surfaces thereof and connected to the first and second lead parts of the first internal electrodes, respectively, and second-polarity external electrodes extending from the side surfaces of the ceramic body to the first and second main surfaces thereof and connected to the third and fourth lead parts of the second internal electrodes, respectively, wherein the number of the first-polarity external electrodes and the number of the second-polarity external electrodes may be two or more, and the first-polarity and second-polarity external electrodes may include first-polarity and second-polarity base electrodes and first-polarity and second-polarity terminal electrodes formed on the first-polarity and second-polarity base electrodes, respectively, and W/L≥0.6 may be satisfied when a length of the ceramic body is L and a width thereof is W, and 150 µm≤BW≤350 µm may be satisfied when a width of each of the first-polarity and second-polarity external electrodes formed on the first and second main surfaces of the ceramic body is BW.

The insulating board 110 may have a structure in which it includes an insulating layer 120 and may include conductive patterns 130 and conductive via holes 140 constituting interlayer circuits as shown in FIG. 6 as necessary. The insulating board 110 may be the printed circuit board 100 including the multilayer ceramic electronic component 100 embedded therein.

After being inserted into the printed circuit board 100, the multilayer ceramic electronic component may undergo various severe conditions during post-processing such as a heat treatment, or the like, performed on the printed circuit board 100.

In particular, contraction and expansion of the printed circuit board 100 during the heat treatment process may be directly transferred to the multilayer ceramic electronic component inserted in the printed circuit board 100, applying stress to a bonding surface between the multilayer ceramic electronic component and the printed circuit board 100.

In the case in which the stress applied to the bonding surface between the multilayer ceramic electronic component and the printed circuit board 100 is greater than adhesive bonding strength, the bonding surface may be separated to cause a delamination defect.

The adhesive bonding strength between the multilayer ceramic electronic component and the printed circuit board 100 may be in proportion to electrochemical bonding force between the multilayer ceramic electronic component and the printed circuit board 100 and an effective surface area of the bonding surface. In order to enhance the effective surface area of the bonding surface between the multilayer ceramic electronic component and the printed circuit board 100, surface roughness of the multilayer ceramic electronic component may be controlled to improve delamination between the multilayer ceramic electronic component and the printed circuit board 100.

In addition, frequency of delamination of the bonding surface with the printed circuit board 100 depending on the surface roughness of the multilayer ceramic electronic component to be embedded in the printed circuit board 100 may be checked.

Further, in the multilayer ceramic electronic component having four or more terminals, the external electrodes having opposite polarities are alternately disposed and the ratio (W/L) of the width of the ceramic body to the length thereof is controlled to satisfy W/L≥0.6, whereby the current path may be shortened and the ESL may be decreased.

As set forth above, in a multilayer ceramic electronic component to be embedded in a board according to exemplary embodiments of the present disclosure, patterns of internal electrodes and polarities of external electrodes are controlled to shorten a current path, whereby ESL may be decreased.

In addition, the number of embedded multilayer ceramic electronic components may be decreased, whereby an occupied area may be decreased.

Further, delamination between the multilayer ceramic electronic component and the board may be decreased by improving bonding strength through obtaining low inductance and controlling surface roughness of a plated layer.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic component to be embedded in a board, comprising:
    a ceramic body including dielectric layers and having first and second main surfaces opposing each other, first and second side surfaces opposing each other, and first and second end surfaces opposing each other;
    first internal electrodes formed in the ceramic body and having first and second lead parts exposed to the respective first and second side surfaces of the ceramic body, and second internal electrodes formed in the ceramic body and having third and fourth lead parts exposed to the respective first and second side surfaces of the ceramic body and spaced apart from the first and second lead parts by a predetermined interval; and
    first-polarity external electrodes extending from the side surfaces of the ceramic body to the first and second main surfaces thereof and connected to the first and second lead parts of the first internal electrodes, respectively, and second-polarity external electrodes extending from the side surfaces of the ceramic body to the first and second main surfaces thereof and connected to the third and fourth lead parts of the second internal electrodes, respectively,
    wherein the number of the first-polarity external electrodes and the number of the second-polarity external electrodes are two or more,
    the first-polarity and second-polarity external electrodes include first-polarity and second-polarity base electrodes, and first-polarity and second-polarity terminal electrodes formed on the first-polarity and second-polarity base electrodes, respectively,
    when L denotes a length of the ceramic body and W denotes a width thereof, W/L≥0.6 is satisfied, and
    a width BW of each of the first-polarity and second-polarity external electrodes formed on the first and second main surfaces of the ceramic body satisfies 150 µm≤BW≤350 µm.

2. The multilayer ceramic electronic component of claim 1, wherein the first internal electrode includes:
   a first region having the first lead part; and
   a second region spaced apart from the first region by a predetermined distance in a length direction of the ceramic body and having the second lead part.

3. The multilayer ceramic electronic component of claim 1, wherein the second internal electrode includes:
   a third region having the third lead part; and
   a fourth region spaced apart from the third region by a predetermined distance in a length direction of the ceramic body and having the fourth lead part.

4. The multilayer ceramic electronic component of claim 1, wherein the first-polarity and second-polarity terminal electrodes are formed of copper (Cu).

5. The multilayer ceramic electronic component of claim 1, wherein a thickness tp of each of the first-polarity and second-polarity terminal electrodes is 5 μm or greater (tp≥5 μm).

6. The multilayer ceramic electronic component of claim 1, wherein when a surface roughness of each of the first-polarity and second-polarity terminal electrodes is Ra and a thickness of each of the first-polarity and second-polarity terminal electrodes is tp, 200 nm≤Ra≤tp is satisfied.

7. The multilayer ceramic electronic component of claim 1, wherein the first-polarity and second-polarity terminal electrodes are formed by plating.

8. The multilayer ceramic electronic component of claim 1, wherein a thickness ts of the ceramic body is 250 μm or less (ts≤250 μm).

9. A printed circuit board having a multilayer ceramic electronic component embedded therein, the printed circuit board comprising:
   an insulating board; and
   a multilayer ceramic electronic component embedded in the insulating board and including:
   a ceramic body including dielectric layers and having first and second main surfaces opposing each other, first and second side surfaces opposing each other, and first and second end surfaces opposing each other;
   first internal electrodes formed in the ceramic body and having first and second lead parts exposed to the respective first and second side surfaces of the ceramic body, and second internal electrodes formed in the ceramic body and having third and fourth lead parts exposed to the respective first and second side surfaces of the ceramic body and spaced apart from the first and second lead parts by a predetermined interval; and
   first-polarity external electrodes extending from the side surfaces of the ceramic body to the first and second main surfaces thereof and connected to the first and second lead parts of the first internal electrodes, respectively, and second-polarity external electrodes extending from the side surfaces of the ceramic body to the first and second main surfaces thereof and connected to the third and fourth lead parts of the second internal electrodes, respectively,
   wherein the number of the first-polarity external electrodes and the number of the second-polarity external electrodes are two or more,
   the first-polarity and second-polarity external electrodes include first-polarity and second-polarity base electrodes, and first-polarity and second-polarity terminal electrodes formed on the first-polarity and second-polarity base electrodes, respectively,
   when L denotes a length of the ceramic body and W denotes a width thereof, W/L≥0.6 is satisfied, and
   a width BW of each of the first-polarity and second-polarity external electrodes formed on the first and second main surfaces of the ceramic body satisfies 150 μm≤BW≤350 μm.

10. The printed circuit board of claim 9, wherein the first internal electrode includes:
    a first region having the first lead part; and
    a second region spaced apart from the first region by a predetermined distance in a length direction of the ceramic body and having the second lead part.

11. The printed circuit board of claim 9, wherein the second internal electrode includes:
    a third region having the third lead part; and
    a fourth region spaced apart from the third region by a predetermined distance in a length direction of the ceramic body and having the fourth lead part.

12. The printed circuit board of claim 9, wherein the first-polarity and second-polarity terminal electrodes are formed of copper (Cu).

13. The printed circuit board of claim 9, wherein a thickness tp of each of the first-polarity and second-polarity terminal electrodes is 5 μm or greater (tp≥5 μm).

14. The printed circuit board of claim 9, wherein when Ra denotes a surface roughness of each of the first-polarity and second-polarity terminal electrodes and tp denotes a thickness of each of the first-polarity and second-polarity terminal electrodes, 200 nm≤Ra≤tp is satisfied.

15. The printed circuit board of claim 9, wherein the first-polarity and second-polarity terminal electrodes are formed by plating.

16. The printed circuit board of claim 9, wherein a thickness ts of the ceramic body is 250 μm or less (ts≤250 μm).

* * * * *